US009165694B2

(12) United States Patent
Garnett et al.

(10) Patent No.: US 9,165,694 B2
(45) Date of Patent: Oct. 20, 2015

(54) NANOWIRE APPARATUSES AND METHODS (71) Applicant: The Board of Trustees of the Leland Stanford Junior University, Palo Alto, CA (US)

(72) Inventors: Erik C. Garnett, Amsterdam (NL); Mark L. Brongersma, Redwood City, CA (US); Yi Cui, Stanford, CA (US); Michael D. McGehee, Palo Alto, CA (US); Mark Greyson Christoforo, Los Altos Hills, CA (US); Wenshan Cai, Marietta, GA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 14/043,603

(22) Filed: Oct. 1, 2013

(65) Prior Publication Data
US 2014/0090870 A1 Apr. 3, 2014

Related U.S. Application Data (60) Provisional application No. 61/708,432, filed on Oct. 1, 2012.

(51) Int. Cl.
*B05D 3/00* (2006.01)
*C08J 7/18* (2006.01)
*H01B 1/00* (2006.01)
*H01B 13/00* (2006.01)
*H01B 1/02* (2006.01)
*B82Y 40/00* (2011.01)
*H01L 31/0224* (2006.01)

(52) U.S. Cl.
CPC .. *H01B 1/00* (2013.01); *H01B 1/02* (2013.01); *H01B 13/0016* (2013.01); *B82Y 40/00* (2013.01); *H01L 31/022466* (2013.01); *Y10T 428/24074* (2015.01); *Y10T 428/24091* (2015.01)

(58) Field of Classification Search
CPC ................................ B82Y 30/00; B82Y 40/00
USPC .......................................................... 427/553
See application file for complete search history.

(56) References Cited

U.S. PATENT DOCUMENTS

| 7,553,371 | B2 * | 6/2009 | Dubrow et al. | 117/90 |
| 7,850,798 | B2 * | 12/2010 | Kaner et al. | 156/62.2 |
| 2008/0315175 | A1 * | 12/2008 | Pauzauskie et al. | 257/12 |
| 2011/0204330 | A1 * | 8/2011 | LeMieux et al. | 257/15 |

OTHER PUBLICATIONS

Garnett et al; Self-limited plasmonic welding of silver nanowire junctions; Nature Materials; Feb. 5, 2012.*

(Continued)

*Primary Examiner* — Michael Wieczorek
(74) *Attorney, Agent, or Firm* — Crawford Maunu PLLC (57) ABSTRACT

Aspects of the present disclosure are directed to apparatuses and methods involving nanowires having junctions therebetween. As consistent with one or more embodiments, an apparatus includes first and second sets of nanowires, in which the second set overlaps the first set. The apparatus further includes a plurality of nanowire joining recrystallization junctions, each junction including material from a nanowire of the first set that is recrystallized into an overlapping nanowire of the second set.

18 Claims, 3 Drawing Sheets

(56) References Cited

OTHER PUBLICATIONS

Gaynor, W., Burkhard, G. F., McGehee, M. D. & Peumans, P. Smooth nanowire/polymer composite transparent electrodes. Adv. Mater. 23, pp. 2905-2910 (2011).
Hecht, D. S., Hu, L. & Irvin, G. Emerging transparent electrodes based on thin films of carbon nanotubes, graphene, and metallic nanostructures. Adv. Mater. 23, pp. 1482-1513 (2011). Abstract Only.
Li, L. et al. Efficient flexible phosphorescent polymer light-emitting diodes based on silver nanowire-polymer composite electrode. Adv. Mater. 23, pp. 5563-5567 (2011). Abstract Only.
Madaria, A. R., Kumar, A. & Zhou, C. Large scale, highly conductive and patterned transparent films of silver nanowires on arbitrary substrates and their application in touch screens. Nanotechnology 22, p. 245201 (2011).
Yang, L. et al. Solution-processed flexible polymer solar cells with silver nanowire electrodes. ACS Appl. Mater. Interf. 3, pp. 4075-4084 (2011).
Yu, Z., Li, L., Zhang, Q., Hu, W. & Pei, Q. Silver nanowire-polymer composite electrodes for efficient polymer solar cells. Adv. Mater. 23, pp. 4453-4457 (2011). Abstract Only.
Yu, Z. et al. Highly flexible silver nanowire electrodes for shape-memory polymer light-emitting diodes. Adv. Mater. 23, pp. 664-668 (2011). Abstract Only.
Erik Garnett, Inorganic-Organic Hybrid Tandem Solar Cells, Global Climate & Energy Project (GCEP) Symposium, Stanford University, Oct. 4, 2011.
Stanford University News Service, Stanford engineers weld nanowires with light, Published online Feb. 13, 2012.
Holland, W. & Hall, D. Frequency shifts of an electric-dipole resonance near a conducting surface. Phys. Rev. Lett. 52, pp. 1041-1044 (1984). Abstract Only.
Thompson, C. V. Grain growth in thin films. Annu. Rev. Mater. Sci. 20, pp. 245-268 (1990). Abstract Only.
Sommer, J. & Herzig, C. Direct determination of grain-boundary and dislocation self-diffusion coefficients in silver from experiments in type-C kinetics. J. Appl. Phys. 72, pp. 2758-2766 (1992). Abstract Only.
Kneipp, K. et al. Single molecule detection using surface-enhanced Raman scattering (SERS). Phys. Rev. Lett. 78, pp. 1667-1670 (1997).
Brongersma, M. L., Hartman, J. W. & Atwater, H. A. Electromagnetic energy transfer and switching in nanoparticle chain arrays below the diffraction limit. Phys. Rev. B 62, pp. R16356-R16359 (2000).
Hirsch, L. R. et al. Nanoshell-mediated near-infrared thermal therapy of tumors under magnetic resonance guidance. Proc. Natl Acad. Sci. USA 100, pp. 13549-13554 (2003).
Mafuné, F., Kohno, J-Y., Takeda, Y. & Kondow, T. Nanoscale soldering of metal nanoparticles for construction of higher-order structures. J. Am. Chem. Soc.125, pp. 1686-1687 (2003). Abstract Only.
Chen, H. et al. Transmission-electron-microscopy study on fivefold twinned silver nanorods. J. Phys. Chem. B 108, pp. 12038-12043 (2004). Abstract Only.
Zou, S. & Schatz, G.c. Narrow plasmonic/photonic extinction and scattering line shapes for one and two dimensional silver nanoparticle arrays. The Journal a/Chemical Physics 121, pp. 12606-12612 (2004). Abstract Only.
Kim, S. J. & Jang, D-J. Laser-induced nanowelding of gold nanoparticles. Appl. Phys. Lett. 86, p. 033112 (2005). Abstract Only.
Xu, S. et al. Nanometer-scale modification and welding of silicon and metallic nanowires with a high-intensity electron beam. Small 1, pp. 1221-1229 (2005). Abstract Only.
Le, F. et al. Plasmons in the metallic nanoparticle-film system as a tunable impurity problem. Nano Lett. 5, pp. 2009-2013 (2005). Abstract Only.
Govorov, A. O. et al. Gold nanoparticle ensembles as heaters and actuators: melting and collective plasmon resonances. Nano. Res. Lett. 1, pp. 84-90 (2006).
Klein, M. W., Enkrich, C., Wegener, M. & Linden, S. Second-harmonic generation from magnetic metamaterials. Science 313, pp. 502-504 (2006). Abstract Only.

Pendry, J. B., Schurig, D. & Smith, D. R. Controlling electromagnetic fields. Science 312, pp. 1780-1782 (2006).
Romero, I. Aizpurua, J., Bryant, G. W. & Garcia de Abajo, F. J. Plasmons in nearly touching metallic nanoparticles: Singular response in the limit of touching dimers. Opt. Express 14, pp. 9988-9999 (2006).
Karim, S. et al. Morphological evolution of Au nanowires controlled by Rayleigh instability. Nanotechnology 17, pp. 5954-5959 (2006). Abstract Only.
Hao, F. & Nordlander, P. Plasmonic coupling between a metallic nanosphere and a thin metallic wire. Appl. Phys. Lett. 89, p. 103101 (2006). Abstract Only.
Soares, B., Jonsson, F. & Zheludev, N. All-optical phase-change memory in a single gallium nanoparticle. Phys. Rev. Lett. 98, p. 153905 (2007).
Shalaev, V. M. Optical negative-index metamaterials. Nature Photon. 1, pp. 41-48 (2007).
Cao, L., Barsic, D. N., Guichard, A. R. & Brongersma, M. L. Plasmon-assisted local temperature control to pattern individual semiconductor nanowires and carbon nanotubes. Nano Lett. 7, pp. 3523-3527 (2007).
Röntzsch, L., Heinig, K-H., Schuller, J. A. & Brongersma, M. L. Thin film patterning by surface-plasmon-induced thermocapillarity. Appl. Phys. Lett. 90, p. 044105 (2007).
Zhang, Y. et al. Tailoring the intrinsic metallic states of double-walled nanotube films by self-soldered laser welding. Appl. Phys. Lett. 91, p. 233109 (2007). Abstract Only.
Gu, Z., Ye, H., Bernfeld, A., Livi, K. J. T. & Gracias, D. H. Three-dimensional electrically interconnected nanowire networks formed by diffusion bonding. Langmuir 23, pp. 979-982 (2007).
Knight, M. W. et al. Nanoparticle-mediated coupling of light into a nanowire. Nano Lett. 7, pp. 2346-2350 (2007). Abstract Only.
Boyd, D. A., Adleman, J. R., Goodwin, D. G. & Psaltis, D. Chemical separations by bubble-assisted interphase mass-transfer. Anal. Chem. 80, pp. 2452-2456 (2008).
García de Abajo, F. J. Nonlocal effects in the plasmons of strongly interacting nanoparticles, dimers, and waveguides. J. Phys. Chem. C112, pp. 17983-17987 (2008).
Stehr, J. et al. Gold nanostoves for microsecond DNA melting analysis. Nano Lett. 8, pp. 619-623 (2008). Abstract Only.
Shin, H. et al. Photoresist-free lithographic patterning of solution-processed nanostructured metal thin films. Adv. Mater. 20, pp. 3457-3461 (2008). Abstract Only.
Mock, J. J. et al. Distance-dependent plasmon resonant coupling between a gold nanoparticle and gold film. Nano Lett. 8, pp. 2245-2252 (2008).
Wei, H. et al. Polarization dependence of surface-enhanced Raman scattering in gold nanoparticle__nanowire systems. Nano Lett. 8, pp. 2497-2502 (2008).
Du, C. et al. Confocal white light reflection imaging for characterization of metal nanostructures. Opt. Commun. 281, pp. 5360-5363 (2008).
Lee, J-Y., Connor, S. T., Cui, Y. & Peumans, P. Solution-processed metal nanowire mesh transparent electrodes. Nano Lett. 8, pp. 689-692 (2008).
Baffou, G., Quidant, R. & Girard, C. Heat generation in plasmonic nanostructures: Influence of morphology. Appl. Phys. Lett. 94, p. 153109 (2009).
Park et al., "Bulk Heterojunction solar cells with internal quantum efficiency approaching 100%", Nature Photonics 3, p. 297 (2009).
Cui, Q., Gao, F., Mukherjee, S. & Gu, Z. Joining and interconnect formation of nanowires and carbon nanotubes for nanoelectronics and nanosystems. Small 5, pp. 1246-1257 (2009). Abstract Only.
Zuloaga, J., Prodan, E. & Nordlander, P. Quantum description of the plasmon resonances of a nanoparticle dimer. Nano Lett. 9, pp. 887-891 (2009).
Prokes, S. M., Alexson, D., Glembocki, O. J., Park, H. D. & Rendell, R. W. Plasmonic behavior of Ag/dielectric nanowires and the effect of geometry. J. Vacuum Sci. Technol. B 27, pp. 2055-2061 (2009).
Chu, Y. & Crozier, K. B. Experimental study of the interaction between localized and propagating surface plasmons. Opt. Lett. 34, pp. 244-246 (2009).

(56) References Cited

OTHER PUBLICATIONS

Liu, N. et al. Plasmonic analogue of electromagnetically induced transparency at the Drude damping limit. Nature Materials 8, pp. 758-762 (2009).

Hu, M., Ghoshal, A., Marquez, M. & Kik, P. G. Single particle spectroscopystudy of metal-film-induced tuning of silver nanoparticle plasmon resonances. J. Phys. Chem. C 114, pp. 7509-7514 (2010).

Ward, D. R., Hü, F., Pauly, F., Cuevas, J. C. & Natelson, D. Optical rectification and field enhancement in a plasmonic nanogap. Nature Nanotech. 5, pp. 732-736 (2010).

Gaynor, W., Lee, J.-Y. & Peumans, P. Fully solution-processed inverted polymer solar cells with laminated nanowire electrodes. ACS Nano 4, pp. 30-34 (2010). Abstract Only.

Kang, M-G., Xu, T., Park, H. J., Luo, X. & Guo, L. J. Efficiency enhancement of organic solar cells using transparent plasmonic Ag nanowire electrodes. Adv. Mater. 22, pp. 4378-4383 (2010). Abstract Only.

Lee, J-Y., Connor, S. T., Cui, Y. & Peumans, P. Semitransparent organic photovoltaic cells with laminated top electrode. Nano Lett. 10, pp. 1276-1279 (2010).

Schuller, J. A. et al. Plasmonics for extreme light concentration and manipulation. Nature Mater. 9, pp. 193-204 (2010).

Hu, L., Kim, H. S., Lee, J-Y., Peumans, P. & Cui, Y. Scalable coating and properties of transparent, flexible, silver nanowire electrodes. ACS Nano 4, pp. 2955-2963 (2010).

Cao, L., Fan, P., Barnard, E. S., Brown, A. M. & Brongersma, M. L. Tuning the color of silicon nanostructures. Nano Lett., pp. 2649-2654 (2010). Abstract Only.

Fan, J. A et al. Self-assembled plasmonic nanoparticle clusters. Science 328, pp. 1135-1138 (2010).

Kekatpure, R., Barnard, E., Cai, W. & Brongersma, M. Phase-Coupled PlasmonInduced Transparency. Physical Review Letters 104, pp. 1-4 (2010). Abstract Only.

\* cited by examiner

NANOWIRE APPARATUSES AND METHODS

RELATED PATENT DOCUMENTS

This patent document claims benefit under 35 U.S.C. §119 to U.S. Provisional Patent Application Ser. No. 61/708,432, entitled "SELF-LIMITING PLASMONIC NANOWIRES" and filed on Oct. 1, 2012, which, along with appendices and any cited references therein, is fully incorporated herein by reference.

BACKGROUND

A variety of devices rely upon conductive components such as electrodes. For many representative devices, such as solar cells and touch screens, it can be desirable for such electrodes to exhibit some degree of transparency. Transparent characteristics may be achieved using conductive meshes, or other components that pass light.

While electrodes having transparent characteristics have been useful, it can be difficult to obtain transparency while maintaining desirable conductivity characteristics. Moreover, various conditions limit processing characteristics for such electrodes. For instance, in many applications, it is desirable to form flexible electrodes on a flexible substrate, such as a plastic-based substrate. However, many plastic and other substrates are not amenable to various processing conditions, such as those involving high heat. Moreover, for various nano-scale applications, it can be difficult to control heating of the materials at desirable locations.

The above and other challenges have been difficult to address for a variety of applications.

SUMMARY

Aspects of the present disclosure are directed towards nanowire apparatuses, systems and related methods, and to addressing challenges such as those discussed above.

In accordance with one or more embodiments, an apparatus includes a first set of nanowires, a second set of nanowires disposed to overlap the first set of nanowires, and a plurality of nanowire-joining recrystallization junctions. Each of the nanowire-joining recrystallization junctions includes material from a nanowire of the first set being recrystallized into an overlapping nanowire of the second set.

Another example embodiment is directed to an apparatus having a plurality of nanowires, a plurality of junctions at which a first one of the nanowires at each junction overlaps a second one of the nanowires at the junction, and a weld at each junction. Each weld has recrystallized material of the second nanowire that connects the first nanowire to the second nanowire, has a crystalline orientation that matches a crystalline orientation of the first nanowire, and that extends from the first nanowire to a grain boundary between the recrystallized material and the second nanowire.

Another example embodiment is directed to a method in which a base layer is provided, a nanowire solution is provided on the base layer and the nanowire solution is activated using light-induced heat generation. The nanowire solution results in a first layer of a plurality of nanowires disposed in a first plane, and a second layer of a plurality of nanowires disposed in a second plane under the first plane. The heat generation creates recrystallization of the second layer into the first layer at overlapping junctions of the first layer and the second layer.

The above summary is not intended to describe each embodiment or every implementation of the present disclosure. The figures and detailed description that follow also exemplify various embodiments.

FIGURES

Various example embodiments may be more completely understood in consideration of the following detailed description in connection with the accompanying drawings, and those in the attached Appendices that form part of this patent document.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

DESCRIPTION OF EXAMPLE EMBODIMENTS

Aspects of the present disclosure are believed to be applicable to a variety of different types of apparatuses, systems and methods involving apparatuses, systems, methods of use, and methods of manufacturing nanowires. While not necessarily limited in this regard, various aspects may be appreciated through a discussion of examples using this context.

Various embodiments are directed towards a network of nanowires having junctions of overlapping nanowires that result from local heating provided by a light source. The creation of these junctions is self-limiting such that once they are welded together, the heating stops. The self-limiting nature of junction creation mitigates or prevents over-heating of surrounding materials (e.g., a base layer upon which the nanowires lie), as well as over-heating of the nanowires themselves. Welded nanowire networks, consistent with various aspects of the present disclosure, have a high level of electrical conductivity compared to the as-made networks due to lower junction resistance, and can be implemented with a high level of transparency in applications useful for passing light.

In more specific embodiments, upper and lower layers of nanowires are joined together by directing light (e.g., laser light) to the upper layer and generating plasmonic resonance therein, and using the plasmonic resonance to focus the light to portions of the nanowires in the lower layers that overlap with nanowires in the upper layer. This focused and localized heating occurs via a gap between the nanowires, such as set by ligands coupled to sidewalls of the nanowires. Material from the locally heated portions of the lower nanowires recrystallizes on the upper nanowires at the junction, forming a solid junction in the gap. As the junction between the nanowires closes and any gap begins to fill, the heating effect of the plasmonic resonance diminishes and the melting/recrystallization terminates. Such a self-terminating heating process thus facilitates welding of the nanowires together while limiting the application of heat to the junction at which the weld is to be made, thus mitigating/preventing undesirable heating of other portions of the nanowires that do not overlap, as well as any substrate under the nanowires.

Various embodiments are directed to a flexible set of nanowires useful in, for example, electrodes, transparent electrodes, solar cells, thermoelectric, sensors, and transistors. The nanowires, used in these applications, include an upper set and a lower set that overlap. The sets of nanowires form recrystallized junctions (e.g., nanowire joining recrystallization junctions) at the overlapping parts of the upper set and the lower set. In certain embodiments, the sets of nanowires are arranged on a base layer. The recrystallization junctions can be formed by heating to a temperature range that is greater than a threshold temperature at which the base layer melts, while limiting the heating to one of the nanowires at the junction.

Additionally, aspects of the present disclosure utilize light to locally heat and create the welding of the flexible set of nanowires selectively at junction points with nanoscale spatial resolution. The local heating results from a strong plasmonic resonance arising from the nanometer-scale gap that naturally forms between nanowires due to surface ligands. Once the nanowires begin to weld together, the gap disappears and the heating subsides, making this a self-limited process. Because the heating is highly local, this optical process can be used on heat sensitive substrates (e.g., low-density flexible polyethylene, polymer solar cells). Accordingly, various aspects of the present disclosure maintain structural and functional characteristics (e.g., electrical conductivity) of the nanowires, and preserve the integrity and flexibility of sensitive underlying materials.

In accordance with other embodiments, an apparatus includes first and second sets of nanowires in which a second set of nanowire portions overlap a first set of nanowire portions, with a plurality of nanowire-joining recrystallization junctions where the nanowires overlap. Each of the nanowire-joining recrystallization junctions includes material from a nanowire of the first set being recrystallized into an overlapping nanowire of the second set.

Some embodiments further include a base layer under the first set and upon which the first set lies. In some embodiments, the apparatus withstands heating greater than a threshold temperature at which recrystallization at the junctions occurs, in which the nanowire-joining recrystallization junctions are formed by heating to a temperature range that is greater than the threshold temperature. In some implementations, the plurality of nanowire-joining recrystallization junctions are formed by heating to a temperature range that is greater than the threshold temperature, such as heating greater than 150° Celsius for over 20 minutes.

In certain embodiments involving the base layer, the recrystallization occurs at a first threshold temperature and the base layer melts at a second threshold temperature that is different than the first threshold temperature. The base layer withstands heating of the first set of nanowires at the junction to the first threshold temperature. For instance, such an approach may involve using light-induced heating via the nanowires to locally heat the junctions to the first threshold temperature, without heating the base layer to the threshold temperature. In this context, the second threshold temperature may be lower than the first threshold temperature.

In some embodiments, the apparatus discussed above includes a light source arranged with the nanowires such that the second set of nanowires is closer to the light source, relative to the first set of nanowires. In some implementations, the light source and nanowires operate together via plasmonic resonance and electromagnetic coupling to use the second set of nanowire portions to focus light to the first set of nanowire portions via the overlap.

The nanowire-joining recrystallization junctions can be formed with a variety of characteristics, to suit particular embodiments and/or material types. In some embodiments, the junctions are characterized by at least one of an amount of the material of the nanowires of the first set that is between a 30 nm and 60 nm overlap with the second set of nanowires, and a tensile strength between 5 to 15 MPa. In other embodiments, the plurality of nanowire-joining recrystallization junctions are part of an electrode that provides at least one of a degree of transparency in a range of 90% to 95%, a degree of sheet resistivity in a range of 1 Ohm/square to 1 kiloOhm/square, flexibility via an ability to bend in half, and durability via a tensile strength between 5 to 15 MPa.

In some embodiments, the recrystallized material has a crystalline orientation that matches a crystalline orientation of the second nanowire and extends from the second nanowire to a grain boundary between the recrystallized material and the first nanowire. The grain boundary may, for example, be in contact with the first nanowire. In some implementations, the first and second nanowires include surface ligands that are configured and arranged to maintain a gap between the first and second nanowires at respective junctions, in which the gap has a distance that is about equal to a length of the surface ligands. The gap is set to facilitate the recrystallization of the material from the nanowire of the first set into the overlapping nanowire of the second set.

In another embodiment, the recrystallization junctions as discussed above each include a weld created by light-induced heat generation and recrystallization of one of the first set of nanowires into one of the second set of nanowires. The apparatus also includes an electrode that includes a base layer (e.g., low-density polyethylene, polyvinylidene chloride (PVDC) and a transparent, flexible plastic), the first set of nanowires and the second set of nanowires. Such an electrode may, for example, be operable to withstand deformation and maintain electrical conductivity. In some implementations, at least one of the nanowires includes a first portion in the first set and a second portion in the second set, with the first portion overlapping one of the nanowires in the first set and the second portion being overlapped by one of the nanowires in the second set. Such electrodes may, for example, be transparent or semi-transparent with an optical transmittance between at least 90% and 95%. The electrode may, for example, be characterized in terms of one or more of flexibility via an ability to bend in half, flexibility via a bending strength between 10 to 40 MPa, durability via tensile strength between 5 to 15 MPa, a degree of transparency in a range of 90% to 95%, and a degree of sheet resistivity in a range of 1 Ohm/square to 1 kiloOhm/square.

Another example embodiment is directed to a method in which nanowires are joined over a base layer as follows. A solution of nanowires is provided on the base layer and used to form a mesh of nanowires with overlapping portions thereof at respective junctions. At each junction, a first nanowire portion is disposed in a first plane and over a second nanowire portion in a second plane under the first plane. The nanowire solution is activated by directing light to the second nanowire portions at each junction, via the (overlapping) first nanowire portion, and using the light and the nanowires to induce heat generation. This heat generation causes recrystallization of material from the second nanowire portion onto the first nanowire potion. In some instances, one or more nanowires may include portions thereof lying in both the first and second plane, respectively lying over and under another one of the nanowires.

In some embodiments, a gap between the nanowires (e.g., set using surface ligands on the nanowires) is used to generate plasmonic resonance. As the recrystallization progresses, the material of the weld begins to close the gap and reduces the plasmonic resonance. As the gap fills, plasmonic resonance is terminated, which is used to terminate the heating and, accordingly, terminate melting and recrystallization of the second nanowire portion.

In a more specific embodiment, the plasmonic resonance is generated using light having a wavelength that is about equal to a wavelength of a surface plasmon resonance of the nanowires. The light is focused to the second nanowire portion using electromagnetic coupling between the generated plasmonic resonance and plasmons.

Figure 1:
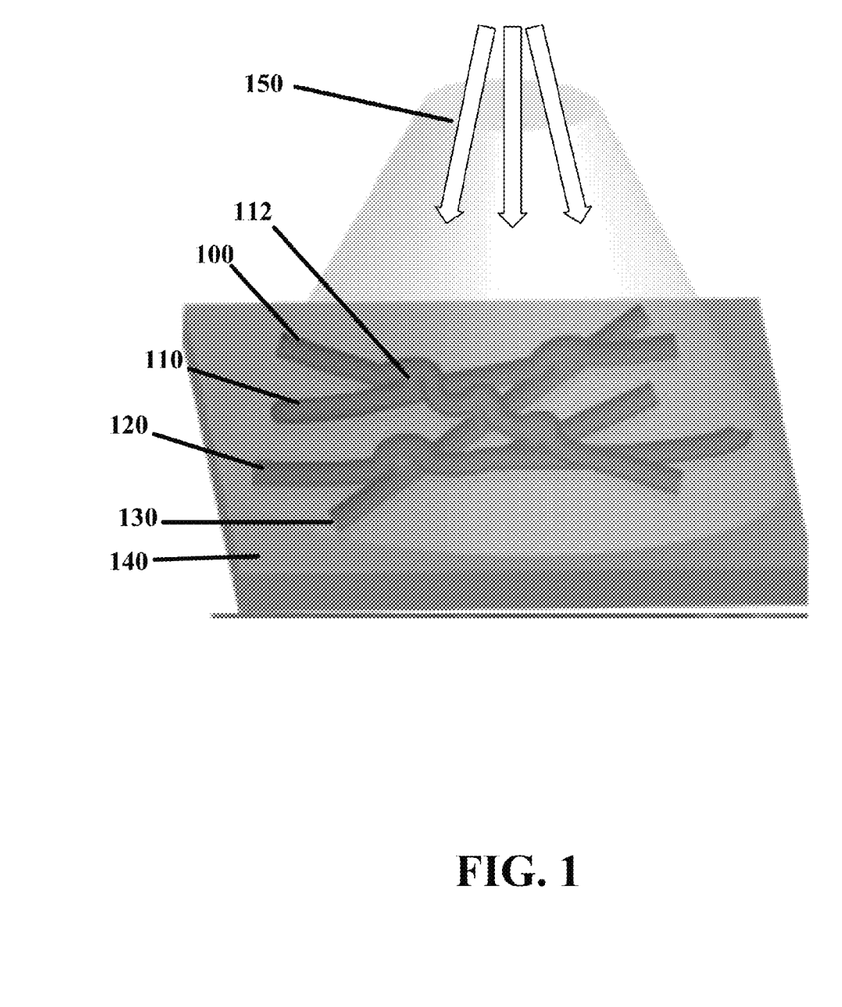
FIG. 1 shows an arrangement of two sets of pluralities of nanowires disposed on a base layer, consistent with one or more embodiments of the present disclosure.

Turning now to the figures, FIG. 1 shows an example arrangement of nanowires on a base layer, in accordance with another example embodiment. FIG. 1 shows nanowires 100, 110, 120 and 130 that overlap (at certain points) and that are arranged on a base layer 140. At overlapping positions are nanowire-joining recrystallization junctions, with junction 112 shown by way of example. These nanowire-joining recrystallization junctions are created in response to heating, which is provided by source light 150.

As consistent with the above, the source light 150 is used to generate plasmonic resonance in overlapping portions of the nanowires (e.g., in a portion of nanowire 100 above the junction 112). This generated resonance interacts with plasmons of nanowire 110 and focuses the light to and melts a portion therein (e.g., to melt a portion of nanowire 110 below the junction 112). This focused light locally heats the portion of nanowire 110 below junction 112, causing that portion to recrystallize onto the portion of nanowire 100 above the junction. As this recrystallization continues, it fills any gap between the nanowires 100 and 110 at the junctions, connecting the nanowires. As the gap continues to fill, the plasmonic interaction between the nanowires diminishes, reducing the heating and eventually terminating the recrystallization.

In various embodiments, the recrystallized material forms a weld at each junction that connects the nanowires at the junction. For instance, such a weld may join nanowires 100 and 110 discussed above, and has a crystalline orientation that matches a crystalline orientation of the nanowire 100 and extends therefrom to a grain boundary between the recrystallized material and the nanowire 110.

Figure 2A:
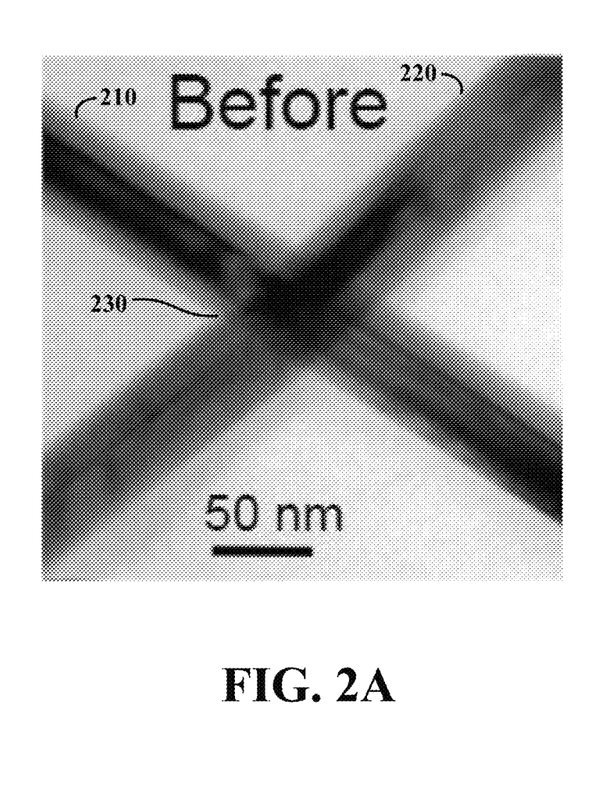
FIG. 2A shows overlapping nanowires, consistent with one or more embodiments of the present disclosure.
Figure 2B:
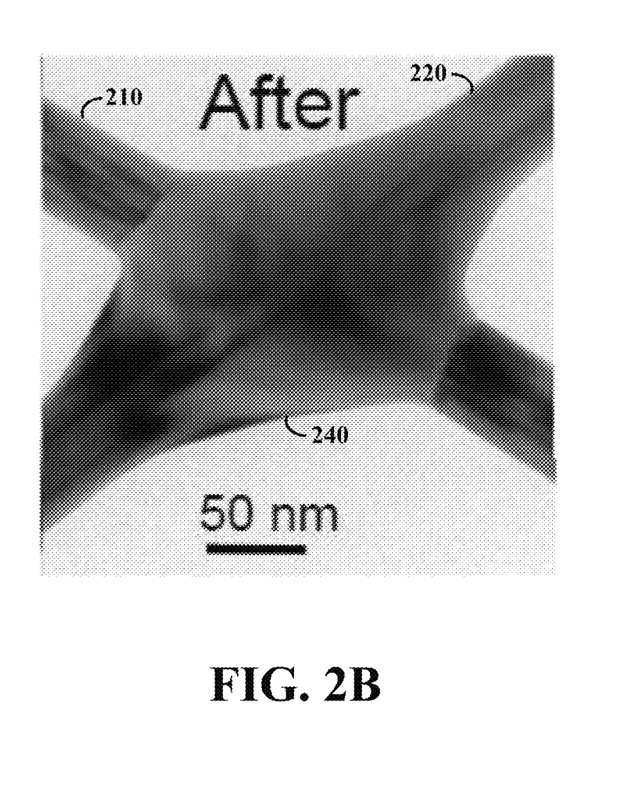
FIG. 2B shows the overlapping nanowires of FIG. 2A with recrystallized junctions that join the nanowires, consistent with one or more embodiments of the present disclosure.

FIG. 2A shows overlapping nanowires amenable for plasmonic welding, and FIG. 2B shows recrystallized junctions that join the nanowires, consistent with one or more embodiments of the present disclosure. Beginning with FIG. 2A, nanowires 210 and 220 overlap at a junction 230, with a gap between the nanowires being set at the junction to facilitate plasmonic resonance. This gap may, for example, be set using ligands coupled to the nanowires (e.g., for a gap of about 5 nm or less).

In FIG. 2B, a weld 240 has been formed of recrystallized material from the underlying nanowire 210, onto overlying nanowire 220. The crystalline orientation of the weld 240 is set via (and matches) the crystalline orientation of nanowire 220, and extends from nanowire 220 to a junction at the underlying nanowire 210. The extent of the weld is effectively controlled by the generation and subsequent termination of plasmonic resonance and related heating that takes place between a small gap at junction 230 and separating the nanowires 210 and 220.

Figures 3A, 3B:
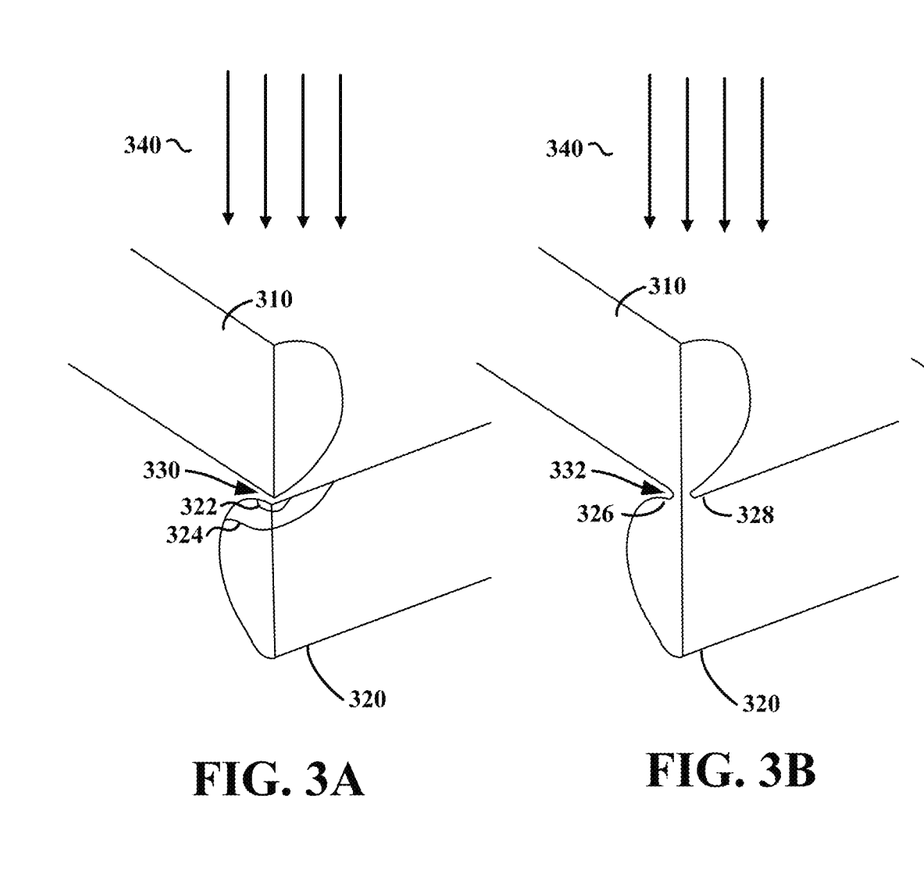
FIG. 3A shows overlapping nanowires with a gap set therebetween, undergoing plasmonic welding, consistent with one or more embodiments of the present disclosure.
FIG. 3B shows the overlapping nanowires of FIG. 3A with portions thereof beginning to join the gap therebetween, consistent with one or more embodiments of the present disclosure.

FIGS. 3A-3B show cross-sections of overlapping nanowires 310 and 320 undergoing a welding process, consistent with one or more embodiments. Beginning with FIG. 3A, the nanowires 310 and 320 are arranged with a gap 330 therebetween (e.g., 2 nm or larger). Light 340 directed to nanowire 310 is focused by the nanowire 310 to an underlying portion of nanowire 320 at the gap 330. This focused light generates localized heating, represented by intensity lines 322 (higher intensity) and 324 (lower intensity).

Figure 3C:
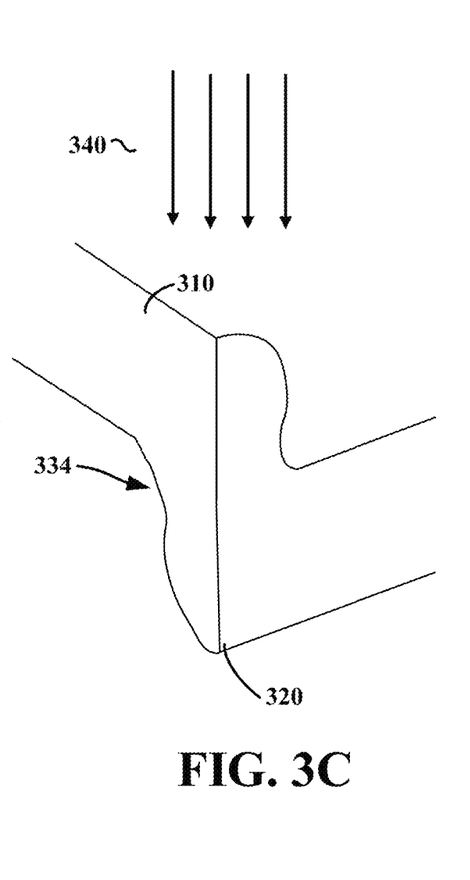
FIG. 3C shows the overlapping nanowires of FIG. 3B near self-termination of plasmonic welding, consistent with one or more embodiments of the present disclosure.

As shown in FIG. 3B, the heating causes recrystallization of portions of the nanowire 320 at the gap 330, onto nanowire 310. This recrystallization joins the nanowires at the gap, with a small weld portion 332 shown having been formed. Heating continues via adjacent gaps at 326 and 328, further recrystallizing material from nanowire 320 onto nanowire 310 and growing of the weld portion 334 as shown in FIG. 3C. Heating is terminated at this point, with the closing of the gap between the nanowires and related termination of plasmonic heating as discussed herein.

Welded nanowires and related processing characteristics are varied to suit different embodiments. In various embodiments, nanowire-joining recrystallization junctions (welds), such as shown in FIG. 3C, are characterized by an amount of the material of the nanowire of a lower nanowire that is between a 30 nm and 60 nm overlap with an upper nanowire. Such nanowires may be implemented with a 100 nm diameter and a circular cross section. The heat generation moves along the seam of overlapping nanowires to form a nanoweld.

Certain embodiments of the present disclosure include nanowire-joining recrystallization junctions that are characterized in terms of durability by having a tensile strength between 5 to 15 MPa. Additionally, due to the flexibility provided by the nanowire recrystallization junctions, the use of these nanowires allow for flexible structures. In certain embodiments, these recrystallization junctions are characterized in terms of flexibility by an ability to bend in half (e.g., with a nanowire mesh being folded upon itself). Additionally, in certain embodiments, nanowire-joining recrystallization junctions are characterized in terms of flexibility by an ability to bend in half, and durability by having a tensile strength between 5 to 15 MPa. Various embodiments of the present disclosure are directed to upper nanowires disposed to overlap lower nanowires, with nanowire-joining recrystallization junctions created at the overlaps being configured as part of an electrode which provides transparency in a range of 90% to 95%. Additionally, certain aspects of the present disclosure are directed toward the nanowires provided as an electrode, which include a degree of sheet resistivity in a range of 1 Ohm/square to 1 kiloOhm/square, and is characterized in terms of flexibility by having a bending strength between 10 and 40 MPa, and durability by having a tensile strength between 5 to 15 MPa. Various embodiments of the present disclosure are also directed towards apparatus, methods, and systems including a light source and overlapping nanowires.

In various embodiments of the present disclosure, nanowires described herein include at least one of copper, silver, or gold. Base layers may include low-density polyethylene, polyvinylidene chloride (PVDC), or a transparent and flexible plastic. In certain embodiments, the base layer has a Young's Modulus between 150 and 450 MPa, and may have a tensile strength between 5 and 15 MPa. Moreover, in certain embodiments, the base layer can be elongated up to 650% of its original size. Additionally, the base layer, in various embodiments of the present disclosure, has a bending strength between 10 and 40 MPa.

Various aspects of the present disclosure are also directed towards methods of manufacturing. Certain methods include providing a nanowire solution on the base layer resulting in overlapping nanowires, such as by spray-coating the solution. The nanowire solution is activated using light-induced heat generation creating recrystallization of nanowires at overlapping junctions to form a plurality of welds as discussed herein. Providing a nanowire solution may include, for example, drop-casting the nanowire solution on the base layer. Additionally, various methods are characterized in that the step of activating the nanowire solution includes shining a light onto the base layer. In these embodiments, nanowires closer to the light focus the light to underlying nanowires at overlapping junctions. Further, certain embodiments of the instant disclosure of methods and apparatuses having an electrode are characterized in that greater than two-thirds of the plurality of welds remains unbroken in response to the use thereof.

The embodiments and specific applications discussed herein (and in the Appendices filed as part of the underlying provisional application Ser. No. 61/708,432) may be implemented in connection with one or more of the above-described aspects, embodiments and implementations, as well as with those shown in the appended figures. This description and the various embodiments are also presented by way of the Provisional Appendices which are incorporated herein by reference, and which are denoted as follows:

Appendix A: "Self-limited plasmonic welding of silver nanowire junctions;"

Appendix B: "Supplementary Information: Self-limited plasmonic welding of silver nanowire junctions;" and Appendix C: "Supplementary Information."

Various embodiments described above, and discussed in the attached Appendices may be implemented together and/or in other manners. One or more of the items depicted in the present disclosure and in the Provisional Appendices can also be implemented in a more separated or integrated manner, or removed and/or rendered as inoperable in certain cases, as is useful in accordance with particular applications. In view of the description herein, those skilled in the art will recognize that many changes may be made thereto without departing from the spirit and scope of the present disclosure.

What is claimed is:

1. A method comprising:
providing a base layer;
providing a nanowire solution on the base layer resulting in a first layer of a plurality of nanowires disposed in a first plane, and a second layer of a plurality of nanowires disposed in a second plane under the first plane; and
activating the nanowire solution using light-induced heat generation and therein creating recrystallization of nanowires in the second layer into nanowires in the first layer at overlapping junctions of the nanowires in the first layer and the nanowires in the second layer, wherein each of the overlapping junctions of the nanowires in the first layer and the second layer includes material from a nanowire of the first layer of the plurality of nanowires being recrystallized into an overlapping nanowire of the second layer of the plurality of nanowires.

2. The method of claim 1, wherein
providing the nanowire solution includes providing at least one of the plurality of nanowires having a first portion at a first junction and in the first layer, and a second portion at a second junction and in the second layer, and
activating the nanowire solution using light-induced heat generation includes recrystallizing a portion of another one of the plurality of nanowires into the first portion, and recrystallizing the second portion into another one of the plurality of nanowires.

3. The method of claim 1, wherein
providing a nanowire solution on the base layer includes providing nanowires at the overlapping junctions with a gap therebetween, and
activating the nanowire solution using light-induced heat generation includes, at each junction, recrystallizing material from a first nanowire in the first plane, onto a second nanowire in the second plane, by generating plasmonic resonance at the gap between the nanowires, in which generating the plasmonic resonance includes:
directing light to the second nanowire, the light having a wavelength that is about equal to a wavelength of a surface plasmon resonance of the nanowires,
using electromagnetic coupling between the generated plasmonic resonance and plasmons in the first nanowire to focus the light to a portion of the first nanowire,
using the focused light to melt a portion of the first nanowire at the gap, and
recrystallizing the melted portion of the first nanowire onto the second nanowire.

4. The method of claim 3, wherein each of the junctions is characterized by at least one of: an amount of the material of the nanowires of the first layer that is between a 30 nm and 60 nm overlap with the nanowires of the second layer, and a tensile strength between 5 to 15 MPa.

5. The method of claim 1, wherein the base layer is configured and arranged to withstand heating greater than a threshold temperature at which recrystallization at the junctions occurs, wherein the plurality of nanowire-joining recrystallization junctions are formed by heating to a temperature range that is greater than the threshold temperature.

6. The method of claim 1, wherein the recrystallization forms a plurality of nanowire-joining recrystallization junctions formed by heating to a temperature range that is greater than a first threshold temperature, the threshold temperature corresponding to heating to a temperature greater than 150° Celsius for over 20 minutes.

7. The method of claim 6, wherein the base layer is configured and arranged to melt at a second threshold temperature that is different than the first threshold temperature, and is configured and arranged to withstand heating of a first set of nanowires in the first layer of the plurality of nanowires.

8. The method of claim 7, further including a step of using a light source and a second set of nanowires on the second layer of the plurality of nanowires, wherein the second set of nanowires is closer to the light source, relative to the first set of nanowires.

9. The method of claim 6, wherein the base layer is configured and arranged to melt at a second threshold temperature that is lower than the first threshold temperature, and is configured and arranged to withstand heating of a first set of nanowires in the first layer of the plurality of nanowires to the first threshold temperature.

10. The method of claim 1, wherein the junctions are configured and arranged as part of an electrode which provides at least one of:
a degree of transparency in a range of 90% to 95%,
a degree of sheet resistivity in a range of 1 Ohm/square to 1 kiloOhm/square,
flexibility via an ability to bend in half, and
durability via a tensile strength between 5 to 15 MPa.

11. The method of claim 1, wherein each of the overlapping junctions includes a weld created by the recrystallization, via the light-induced heat generation, and further including the steps of forming an electrode including the base layer, the electrode being configured and arranged to withstand deformation and maintain electrical conductivity.

12. The method of claim 1, wherein the first layer and the second layer and the overlapping junctions are configured and arranged to provide, from a perspective directed at the base layer and from a side of the first layer and the second layer which is opposite the base layer, an optical transmittance that is between at least 90% and 95%.

13. The method of claim 1, wherein the base layer includes at least one of: low-density polyethylene, polyvinylidene chloride (PVDC) and a transparent, flexible plastic.

14. The method of claim 1, wherein the base layer and the first layer and second layer provide an electrode structure that is characterized in terms of at least one of:
    flexibility via an ability to bend to bend in half,
    flexibility via a bending strength between 10 to 40 MPa,
    durability via tensile strength between 5 to 15 MPa,
    a degree of transparency in a range of 90% to 95%, and
    a degree of sheet resistivity in a range of 1 Ohm/square to 1 kiloOhm/square.

15. A method comprising:
    providing a base layer;
    providing a nanowire solution on the base layer resulting in a first layer of a plurality of nanowires disposed in a first plane, and a second layer of a plurality of nanowires disposed in a second plane under the first plane; and
    activating the nanowire solution using light-induced heat generation and therein creating recrystallization of nanowires in the second layer into nanowires in the first layer at overlapping junctions of the nanowires in the first layer and the nanowires in the second layer, wherein the recrystallization is characterized as a material that has a crystalline orientation which matches a crystalline orientation of the nanowires of the second layer and extends from the second layer to a grain boundary between the recrystallized material and the first layer.

16. The method of claim 15, wherein the grain boundary is in contact with nanowires of the first layer.

17. The method of claim 15, wherein the first and second layers of nanowires include surface ligands that are configured and arranged to maintain a gap between nanowires of the first and second layers at respective junctions, the gap having a distance that is about equal to a length of the surface ligands and being configured and arranged to facilitate the recrystallization.

18. A method comprising:
    providing a base layer;
    providing a nanowire solution on the base layer resulting in a first layer of a plurality of nanowires disposed in a first plane, and a second layer of a plurality of nanowires disposed in a second plane under the first plane; and
    activating the nanowire solution using light-induced heat generation and therein creating recrystallization of nanowires in the second layer into nanowires in the first layer at overlapping junctions of the nanowires in the first layer and the nanowires in the second layer, wherein creating recrystallization of the nanowires in the second layer into nanowires in the first layer includes forming a weld by melting a portion of the nanowires in the second layer and recrystallizing the melted portion onto overlying nanowires in the first layer.

* * * * *